United States Patent
Chung et al.

(10) Patent No.: US 7,598,607 B2
(45) Date of Patent: Oct. 6, 2009

(54) SEMICONDUCTOR PACKAGES WITH ENHANCED JOINT RELIABILITY AND METHODS OF FABRICATING THE SAME

(75) Inventors: Hyun-Soo Chung, Gyeonggi-do (KR); Dong-Hyeon Jang, Gyeonggi-do (KR); Nam-Seog Kim, Gyeonggi-do (KR); Sun-Won Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/123,367

(22) Filed: May 19, 2008

(65) Prior Publication Data

US 2008/0290492 A1 Nov. 27, 2008

(30) Foreign Application Priority Data

May 22, 2007 (KR) .................. 10-2007-0049766

(51) Int. Cl.
*H01L 23/02* (2006.01)
(52) U.S. Cl. ...................... 257/686; 257/777
(58) Field of Classification Search ............ 257/686, 257/777
See application file for complete search history.

(56) References Cited

U.S. PATENT DOCUMENTS 6,714,418 B2 3/2004 Frankowsky et al.

FOREIGN PATENT DOCUMENTS

| JP | 2006-165320 | 6/2006 |
|----|-------------|--------|
| KR | 2006-0064518 | 6/2006 |
| KR | 2007-0006327 | 1/2007 |

*Primary Examiner*—Thien F Tran
(74) *Attorney, Agent, or Firm*—Marger Johnson & McCollom, P.C.

(57) ABSTRACT

Provided is a semiconductor package with enhanced joint reliability and methods of fabricating the same. The method includes: forming package units including a semiconductor chip interposed between a bottom layer and a top layer; and sequentially stacking the package units on a substrate. The bottom layer and the top layer are formed of a material having a lower modulus than the semiconductor chip. The semiconductor package includes: at least one package unit disposed on a substrate, the package unit including a semiconductor chip having a pad, a bottom layer and a top layer substantially surrounding the semiconductor chip, and a redistribution structure overlying the top layer. The redistribution structure is electrically connected to the pad.

14 Claims, 5 Drawing Sheets

SEMICONDUCTOR PACKAGES WITH ENHANCED JOINT RELIABILITY AND METHODS OF FABRICATING THE SAME

CROSS-REFERENCE TO RELATED APPLICATIONS

This U.S. non-provisional patent application claims priority under 35 U.S.C. § 119 to Korean Patent Application No. 10-2007-0049766, filed on May 22, 2007, the entire contents of which are hereby incorporated by reference.

BACKGROUND

1. Technical Field

The present invention disclosed herein relates to a semiconductor package and a method of fabricating the same, and more particularly, to a semiconductor package with enhanced joint reliability and methods of fabricating the same.

2. Description of the Related Art

Generally, semiconductor device fabrication include a front-end process in which integrated circuit (IC) chips are formed on a wafer through photolithography, deposition, and etching processes, and a back-end process that assembles and packages each of the IC chips. Four important functions of the packaging in the back-end process are as follows:

1. protecting the chips from environmental and handling damage;
2. forming connections on the chips for transmitting input/output signals;
3. physically supporting the chips; and
4. providing heat dissipation for the chips.

The proliferation of highly integrated and portable electronic devices is pushing semiconductor packaging technology to meet demands for improved electrical capabilities, reduced cost, lighter weight and slimmer profiles. To satisfy these demands, package-on-package (POP), chip scale packaging (CSP) and wafer-level packaging (WLP) technologies have been introduced. Furthermore, a 3-D stacking technology for stacking semiconductor chips on a substrate has been suggested to satisfy the technical demands for increased packaging density.

Since the 3-D stacking technology can drastically reduce the interconnection length between chips, it is considered to be a method capable of overcoming technical limitations such as signal delay and power consumption. Furthermore, the 3-D stacking technology provides improved technical aspects including electrical characteristics, form factor, size and density.

However, a semiconductor package, which is manufactured through a typical 3-D stacking technology, is vulnerable to thermal stress caused by heat generated from a semiconductor chip or supplied during a manufacturing process, or a mechanical stress caused due to an external force. For example, since the thermal or mechanical stress is concentrated on bumps that connect semiconductor chips electrically, the bumps may be damaged. As a result, joint reliability of a package structure may be deteriorated.

SUMMARY

The present invention provides a semiconductor package with enhanced joint reliability and methods of fabricating the same.

According to some embodiments of the present invention, a semiconductor package includes: a substrate; and at least one package unit stacked on the substrate, each of the package units including a semiconductor chip having a pad, a bottom layer and a top layer substantially surrounding the semiconductor chip, and a redistribution structure overlying the top layer. The redistribution structure is electrically connected to the pad. The top layer and the bottom layer have a lower modulus than the redistribution structure and the semiconductor chip.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Figure 1:
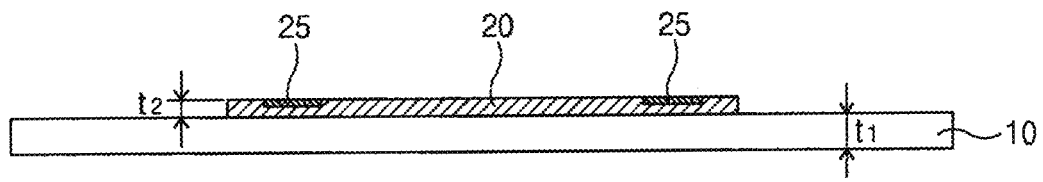
FIGS. 1 through 6 are cross-sectional views illustrating a method of fabricating a semiconductor package according to an embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

FIGS. 1 through 6 are cross-sectional views illustrating a method of fabricating a semiconductor package according to an embodiment of the present invention.

Referring to FIG. 1, a semiconductor chip 20 is attached on a bottom layer 10. The semiconductor chip 20 includes at least one input/output pad (hereinafter, referred to as a pad) 25 connected to an internal circuit, and the position of the pad 25 may vary according to the design of the semiconductor chip 20. The semiconductor chip 20 is manufactured through a front-end process, and a plurality of semiconductor chips may be attached on one bottom layer. The semiconductor chip 20 may be, for example, a memory chip or a logic circuit chip.

The bottom layer 10 may be formed of a material having a lower modulus than the semiconductor chip 20. Specifically, the bottom layer 10 may be formed of at least one among materials having Young's modulus between about 10 MPa and about 1 GPa. More preferably, the bottom layer 10 is formed of at least one among materials having Young's modulus between about 10 MPa and about 100 MPa. For example, the bottom layer 10 may be formed of at least one of silicone compounds, rubber compounds, photosensitive resin compounds, and synthetic resin compounds.

Additionally, the thickness $t_2$ of the semiconductor chip 20 may be between about 10 μm and about 100 μm. According to an embodiment, the thickness $t_2$ of the semiconductor chip 20 may be below about 30 μm. When the semiconductor chip 20 has such a small thickness, it may be easily deformed by thermal or mechanical stress. However, if the bottom layer 10 is formed of a material with a low modulus, deformation of the semiconductor chip 20 due to an external stress can be reduced. According to the embodiments, the thickness $t_1$ of the bottom layer 10 ranges from about 5 μm to about 1000 μm.

If the bottom layer 10 is formed of one of silicone compounds, rubber compounds, photosensitive resin compounds, and synthetic resin compounds, the semiconductor chip 20 may be attached on the bottom layer 10 without an additional adhesive layer. However, according to another embodiment, an adhesive layer (not shown) may be further formed between the bottom layer 10 and the semiconductor chip 20 to promote adhesion therebetween.

Figure 2:
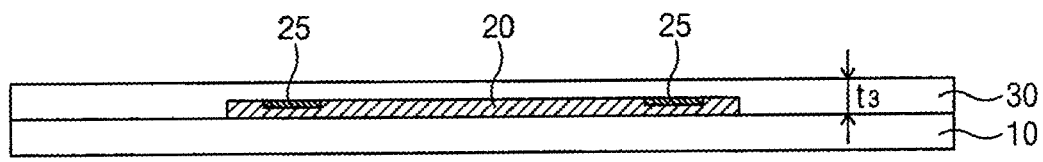

Referring to FIG. 2, a top layer 30 is formed on the bottom layer 10 having the semiconductor chip 20. In this case, the semiconductor chip 20 is substantially surround, or sealed, by the top layer 30 and the bottom layer 10.

According to the present invention, the top layer 30 may be formed of a material having a lower modulus than the semiconductor chip 20. That is, the top layer 30 may be formed of at least one among materials having Young's modulus between about 10 MPa and about 1 GPa. More preferably, the top layer 30 is formed of at least one among materials having Young's modulus between about 10 MPa and about 100 MPa. Additionally, the top layer 30 may be formed of at least one of silicone compounds, rubber compounds, photosensitive resin compounds, and synthetic resin compounds. According to one embodiment, the top layer 30 may be formed of the same material as the bottom layer 10. According to another embodiment, the top layer 30 may be formed of a material different from that of the bottom layer 10.

The thickness $t_1$ of the top layer 30 ranges from about 5 μm to about 1000 μm. As described above, since the semiconductor chip 20 is sealed by the top layer 30 and the bottom layer 10 of a low modulus material, the deformation of the semiconductor chip 20 due to an external stress may be further reduced, and the probability that the semiconductor chip 20 will be separated from the top layer 30 or the bottom layer 10 is also reduced. For example, when only one of the bottom layer 10 and the top layer 30 covers the semiconductor chip 20, the semiconductor chip 20 may be separated from the top layer 30 or the bottom layer 10 because of gravity applied to the semiconductor chip 20 and heat generated in the semiconductor chip 20 and supplied during a manufacturing process. However, as described above, when the semiconductor chip 20 is sealed by the top layer 30 and the bottom layer 10, such separation can be effectively prevented.

Figure 3:
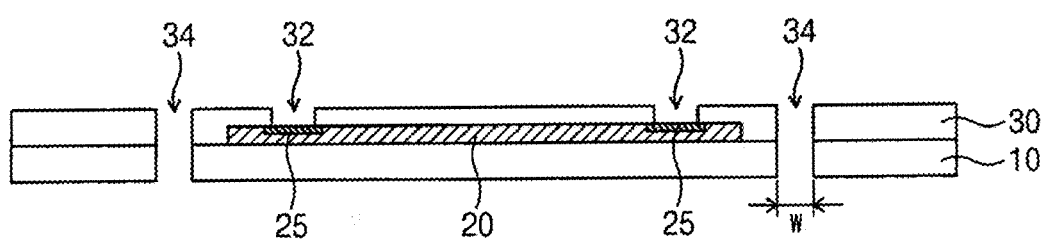

Referring to FIG. 3, the top layer 30 and the bottom layer 10 are patterned to form a via hole 34 penetrating the top layer 30 and the bottom layer 10 and a pad opening part 32 penetrating the top layer 30 to expose the pad 25.

The patterning process may be performed using one of a photolithography and etching process, a laser drilling process, a mechanical drilling process, and an ion-beam drilling process. The photolithography and etching process includes forming the photoresist pattern for defining the via hole 34 and the pad opening part 32 on the top layer 30 and etching the top layer 30 and the bottom layer 10 by using the photoresist pattern as an etching mask. At this point, to reduce etching damage for the pad 25, the etching of the top layer 30 may be performed using an etching recipe having an etching selectivity with respect to the pad 25. According to this embodiment, the via hole 34 and the pad opening part 32 are simultaneously formed.

Because the bottom layer 10 and the top layer 30 can be easily etched compared to the semiconductor chip 20 (i.e., a wafer), it is easier to fabricate a semiconductor package compared to a conventional through substrate via (TSV) technology that includes a step of forming a via hole to penetrate the wafer. Because of this ease of etching, the present invention can be used to fabricate a semiconductor package with lower cost, higher reliability, and higher productivity compared to a conventional technology.

Moreover, the via holes 34 may be formed around the semiconductor chip 20, being spaced apart from the edge of the semiconductor chip 20. At this point, positions where the via holes 34 are formed may be selected such that the package units are electrically connected to each other during a subsequent step of stacking the package units. That is, the intervals between the via holes 34 and the semiconductor chip 20 and the positions of the via holes 34 may be determined by considering the electrical connections. The width of the via holes 34 may range from about 10 μm to about 100 μm.

Figure 4:
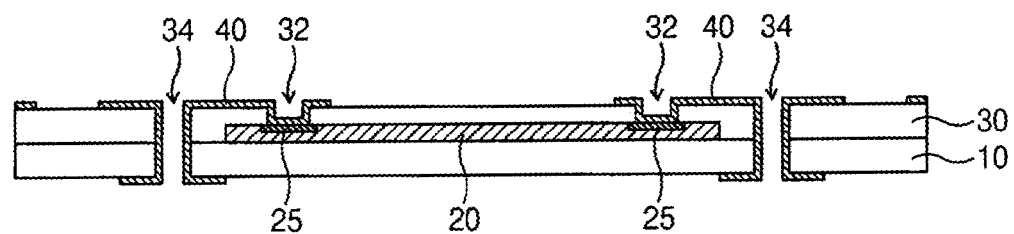

Referring to FIG. 4, a redistribution structure 40, which is connected with the exposed top surface of the pad 25, is formed using a redistribution process.

The redistribution process forms new interconnections that are electrically connected to the pads 25 of the semiconductor chip 20 to facilitate easy package processing. The redistribution structure 40 includes new interconnections used for the above purpose. Specifically, in a case of a package structure including stacked semiconductor chips, the semiconductor chips may be electrically connected through the redistribution structure regardless of the position of the pads 25. That is, when using the redistribution structure 40, various and simple connection techniques can be used, because the electrical connection between the semiconductor chips is not limited to the positions of the pads.

According to an embodiment of the present invention, the forming of the redistribution structure 40 further includes a step of forming a mold layer having a mold opening part 32, which defines the shape of the redistribution structure 40, on the resultant structure having the via hole 34 and the pad opening part 32 and a step of forming a metal layer using an electroplating technique to fill the mold opening part 32. Alternately, a seed layer, which will be used as a seed electrode during the electroplating step, may be formed before forming the metal layer. The seed layer may be formed through a sputtering or evaporation technique. Here, the thickness of the mold layer (i.e., the thickness of the redistribution structure 40) may be between about 1 μm and about 50 μm. More preferably, the thickness of the molder layer is between about 2 μm and about 10 μm.

A method of fabricating the redistribution structure 40 is not limited to the above method, however, and the redistribution structure 40 can be realized through various other methods. For example, the fabricating of the redistribution structure 40 may include a step of forming of the seed layer and the metal layer and a step of patterning the metal layer and the seed layer using a photolithography and etching process.

The redistribution structure 40 is extended from the pad 25 so as to cover an inner wall of the via hole 34. As shown in FIG. 4, the redistribution structure 40 might not completely fill the via hole 34, or may extend a short distance along the bottom surface of the bottom layer 40. According to another embodiment, although the redistribution structure 40 may cover the inner wall of the via hole 34, it might not extend along the bottom surface of the bottom layer 10.

Figure 5:
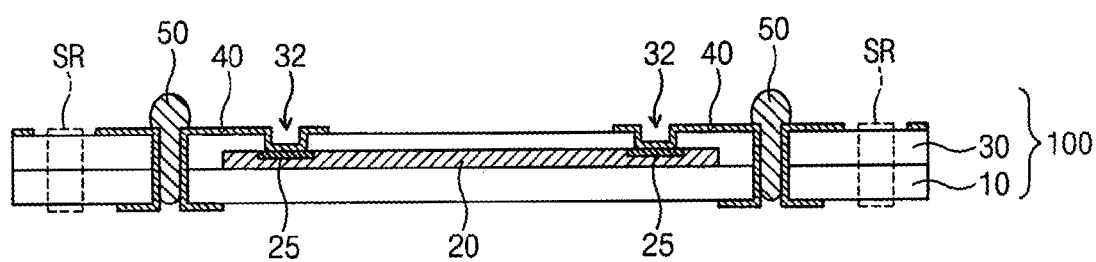

Referring to FIG. 5, connecting elements 50 are formed on the redistribution structures 40. The connecting elements 50 may be formed using one of a ball bump jet technique, an electroplating technique, and a bump printing technique. According to one embodiment, the connecting elements 50 may be formed using a process of forming the redistribution structure 40. That is, the connecting elements 50 and the redistribution structure 40 may be formed using the same process.

Meanwhile, the connecting elements 50 may be formed on the top or the bottom of the via holes 34. According to one embodiment, the connecting elements 50 extend into the via hole 34 to fill a portion of the via hole 34, as shown in FIG. 5. In this case, a contact area between the connecting element 50 and the redistribution structure 40 increases, such that contact resistance may be reduced. Furthermore, when the connecting element 50 fills a portion of the via hole 34, it may be robustly jointed to the redistribution structure 40.

Additionally, since the bottom layer 10 and the top layer 30 are formed of a flexible material with a low modulus, a mechanical stress applied to the connecting element 50 may be absorbed into the bottom layer 10 and the top layer 30 through the sidewall of the via hole 34. Due to this stress absorption, the package structure of this invention provides enhanced joint reliability.

Next, individual package units 100 are separated by cutting the bottom layer 10 and the top layer 30 through a dicing process. The semiconductor chip 20, the top layer 30, the bottom layer 10, the redistribution structure 40, and the connecting element 50 can be referred to as a package unit 100.

The dicing process includes cutting the bottom layer 10 and the top layer 30 along a separation region SR around the semiconductor chip 20. At this point, the separation region SR may be disposed between adjacent semiconductor chips 20 (i.e., between the redistribution structures 40 connected to the respectively different semiconductor chips 20). The dicing process may be realized using one of a laser, a saw, and a knife.

Figure 6:
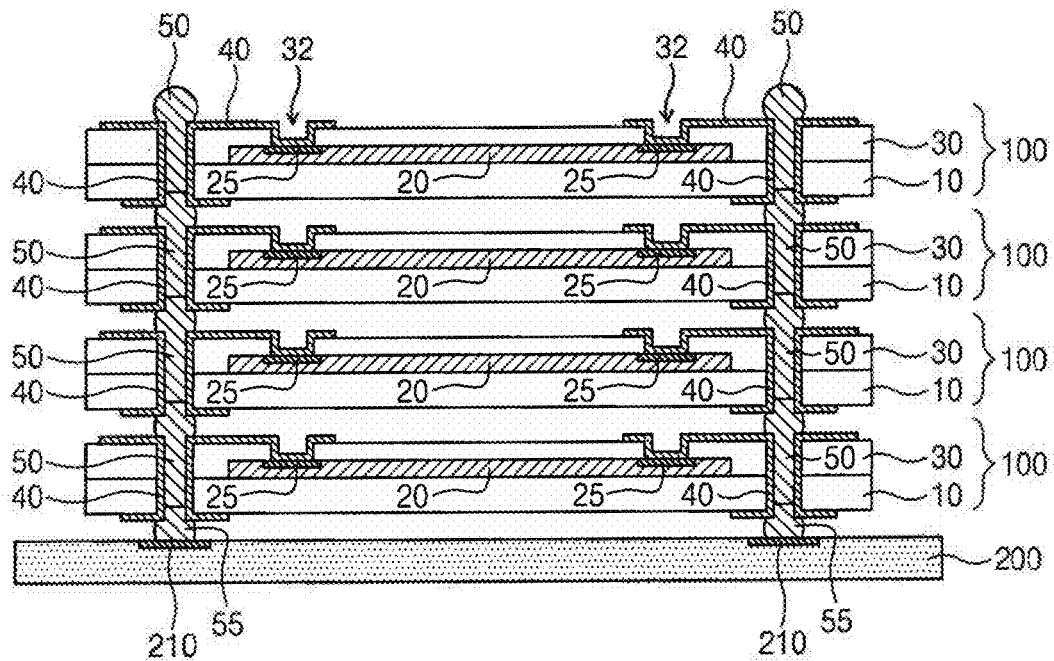

Referring to FIG. 6, the package units 100 separated through the dicing process are sequentially stacked on a substrate 200 (although four package units are illustrated in FIG. 6, the number of the package units 100 may vary). Substrate pads 210 are disposed on the substrate 200, and the connecting elements 50 of the package units 100 are connected to the substrate pads 210. The package unit 100 and the substrate pads 210 may be connected through a substrate connecting element 55. Connecting terminals (not shown) may be formed on a predetermined region of the substrate 200 to be electrically connected to an external electronic device.

The stacked package units 100 are electrically connected to each other through the connecting elements 50 and/or the redistribution structures 40. In more detail, as illustrated in FIG. 6, the connecting elements 50 of one package unit 100 are electrically connected to the redistribution structure 40 of another package unit 100 that is disposed on the top or the bottom of the connecting elements 50. A process for this electrical connection can include a step of bonding the connecting elements 50 to the redistribution structure 40 of another package unit by melting and cooling the connecting elements 50.

Additionally, because the connecting element 50 is compressed to another package unit 100 in a melted state, it may be inserted in the via hole 34 of another package unit. Since the package units 100 are structurally supported by the connecting elements 50, stress applied to the package unit 100 may be concentrated on the connecting elements 50. However, since the bottom layer 10 and the top layer 30 are formed of a flexible material having a low modulus, stress applied to the connecting elements 50 can be absorbed into the bottom layer 10 and the top layer 30 through the sidewall of the via hole 34. Due to this stress absorption, the package structure of this invention provides enhanced joint reliability.

According to an embodiment, the package unit 100 includes the connecting elements 50 having respectively different melting points. More specifically, as the position of the package unit 100 becomes far from the substrate 200, the connecting element 50 of the package unit 100 can have the lower melting point. When the connecting elements 50 have the different melting points, a defective package unit can be selectively replaced. As a result, yield of the package structure according to this embodiment will increase.

According to some embodiments of the invention, the package unit 100 may be tested after the dicing process to determine whether the package units 100 are defective or not. Only the package units 100 passing the test are sequentially stacked on the substrate 200. On the other hand, according to a modified embodiment, multiple packages as shown in FIG. 5 can be stacked, and then the dicing process may be performed. More specifically, the stacking may be done first and then the dicing process can be performed. In this case, since the package units are packaged without the test process, the final yield of the package structure may be reduced compared to the above embodiment.

Figure 7:
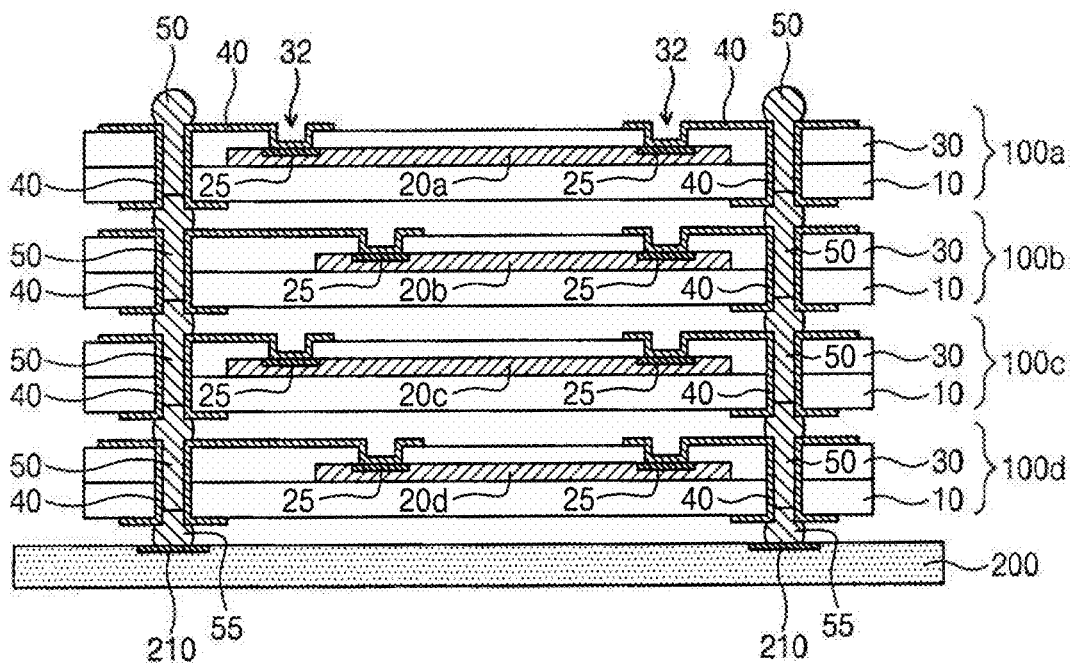
FIGS. 7 and 8 are cross-sectional views illustrating a method of fabricating a semiconductor package according to other embodiments of the present invention.
Figure 8:
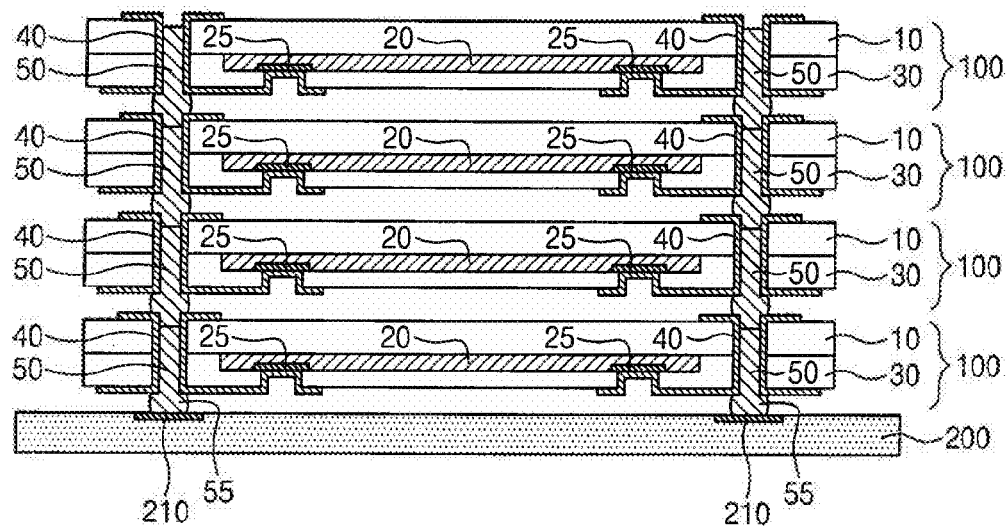

FIGS. 7 and 8 are cross-sectional views illustrating a method of fabricating a semiconductor package according to other embodiments of the present invention. These embodiments are similar to the embodiment of FIGS. 1 through 6. Therefore, overlapping description will be omitted for conciseness.

Referring to FIG. 7, package units 100a, 100b, 100c, and 100d of the package structure may include semiconductor chips 20a, 20b, 20c, and 20d having respectively different sizes or types. In other words, at least one of the semiconductor chips 20a, 20b, 20c, and 20d can be different from at least one other of the semiconductor chips 20a, 20b, 20c, and 20d in one or more of size, shape, and function. In this case, integrated memory logic using memory chips and logic circuit chips can be easily realized.

Referring to FIG. 8, according to the package structure of this embodiment, the package units 100 are rotated with respect to the package units 100 of other embodiments. In particular, the top layer 30 of each package unit 100 is more adjacently attached to the substrate 200 compared to the bottom layer 10. As a result, the package units 100 of the package structure of FIG. 8 are stacked on the substrate 200 in an opposite orientation (i.e. rotated approximately 180 degrees) from the package units 100 of other embodiments. In this case, the package unit 100 can be bonded to the substrate pad 210 without the substrate connecting element 55.

Figure 9:
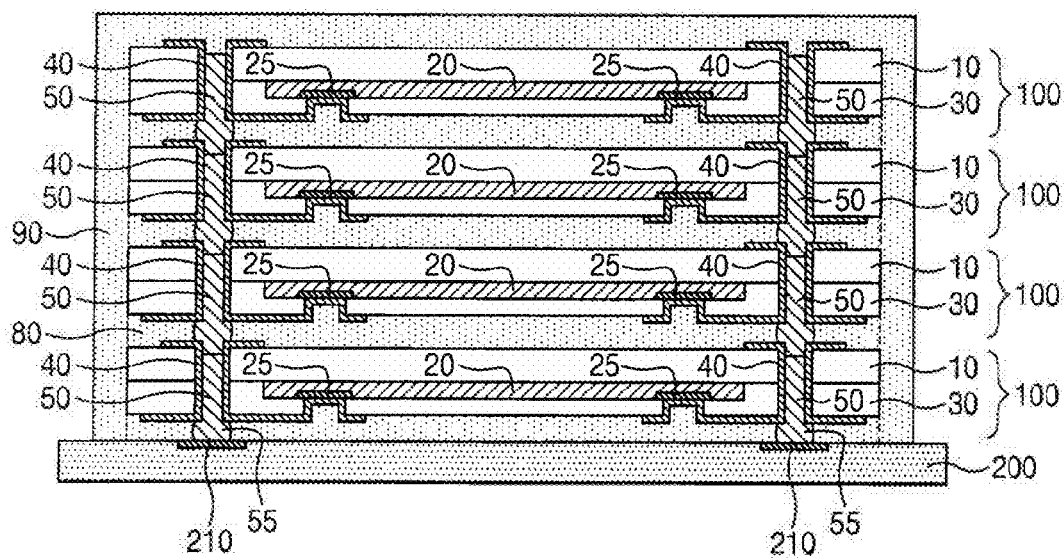
FIGS. 9 and 10 are cross-sectional views illustrating semiconductor packages and a method of fabricating the same according to the present invention.
Figure 10:
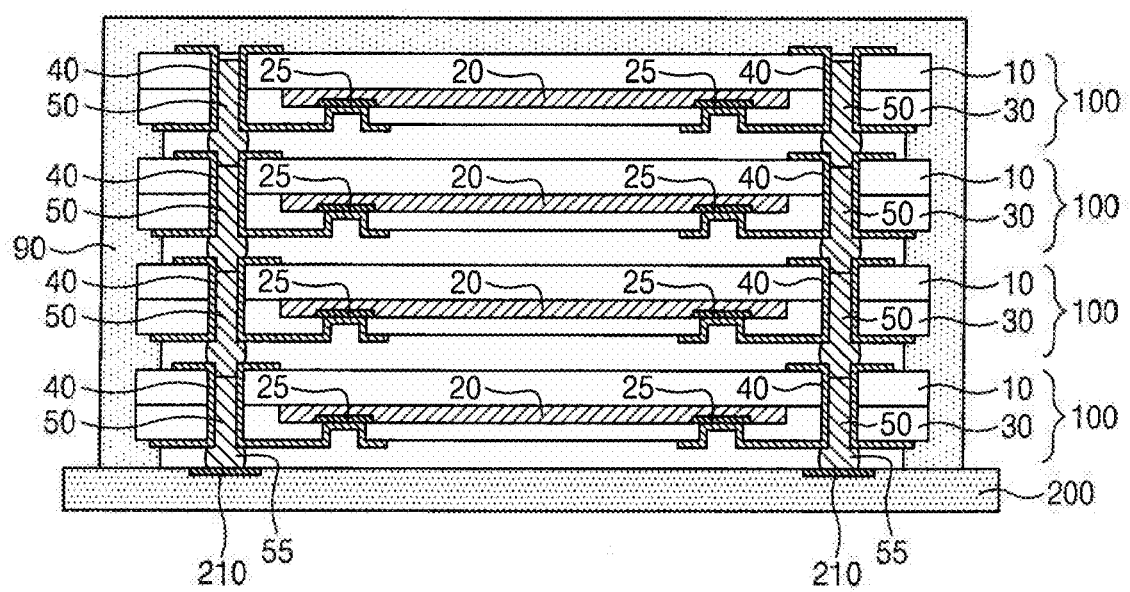

FIGS. 9 and 10 are cross-sectional views illustrating semiconductor packages and a method of fabricating the same according to the present invention.

This embodiment is similar to the above embodiments. Therefore, overlapping description will be omitted for conciseness.

Referring to FIGS. 9 and 10, a passivation layer 90 is formed on the substrate 200 so as to cover the stacked package units 100. The passivation layer 90 protects the package units 100 from an external impact or impurity materials.

Furthermore, according to this embodiment, an underfill layer 80 may be disposed between each of the package units 100 and between the substrate 200 and a lowermost one of the package units 100. The connecting elements 50, the substrate 200, the top layer 30, and the bottom layer 10 may have respectively different thermal expansion coefficients, and stress may be applied to the connecting elements 50 due to the thermal expansion coefficients. To reduce the stress due to the different thermal expansion coefficients, the underfill layer 80 may be formed of a material having an intermediate thermal expansion coefficient. Furthermore, the underfill layer 80 can structurally support the package units 100.

According to an embodiment of the present invention, the underfill layer 80 may be formed of a material in a colloid or jelly state or a material having modulus lower or equal to that of the top layer 30 or the bottom layer 10.

Referring to FIG. 10, a passivation layer 90 is formed to cover the stacked package units 100. However, according to this embodiment, unlike the embodiment of FIG. 9, the underfill 80 is not formed between the package units 100. Thus, empty spaces between the package units 100 remain.

According to some embodiments, the package structure of FIG. 8 can be used in either of the embodiments of FIGS. 9 and 10, and the package structure of FIGS. 6 and 7 can also be used in the embodiments of FIGS. 9 and 10.

According to the present invention, the semiconductor chip is surrounded by the top layer and the bottom layer of a material having a low modulus. Accordingly, thermal or mechanical stress can be absorbed by the top layer and/or the bottom layer. Consequently, the reduction of joint reliability, which is caused by stress applied to the connecting elements that connect the semiconductor chips, can be minimized.

Embodiments of the present invention provide methods of fabricating a semiconductor package including: forming package units including a semiconductor chip interposed between a bottom layer and a top layer; and sequentially stacking the package units on a substrate. The bottom layer and the top layer are formed of a material having a lower modulus than the semiconductor chip.

In some embodiments, the bottom layer and the top layer are formed of a material having a modulus between about 10 MPa and about 1 GPa.

In other embodiments, the bottom layer and the top layer are at least one of silicone compounds, rubber compounds, photosensitive resin compounds, and synthetic resin compounds.

In still other embodiments, the bottom layer and the top layer have a thickness between about 10 μm and about 1000 μm.

In even other embodiments, the semiconductor chip has a thickness between about 10 μm and about 100 μm.

In yet other embodiments, the forming of the package unit further includes: attaching at least one semiconductor chip having a pad on the bottom layer; forming the top layer on the bottom layer to cover the semiconductor chip; patterning the top layer and the bottom layer to form a pad opening part and a via hole, the pad opening part exposing the pad, the via hole penetrating the top layer and the bottom layer; and forming a redistribution structure to contact the pad and at least cover an inner wall of the via hole.

In further embodiments, the forming of the pad opening part and the via hole uses one of a photolithography and etching process, a laser drilling process, a mechanical drilling process, and an ion-beam drilling process.

In still further embodiments, the forming of the package unit further includes forming a connecting element that contacts the redistribution structure after the forming of the redistribution structure.

In even further embodiments, the forming of the connecting element uses one of ball bump jet technique, electroplating technique, and bump printing technique.

In yet further embodiments, the connecting element is formed on the top or the bottom of the via hole to fill a portion of the via hole.

In still further embodiments, the sequentially stacking of the package units further includes bonding the connecting element of the package unit to the redistribution structure of another package unit. The bonding of the connecting element further includes inserting the connecting element of the package unit into the via hole of another package unit after melting the connecting element.

In yet further embodiments, a melting point of the connecting element of the package unit decreases as a position of the corresponding package unit becomes far from the substrate.

In still further embodiments, the forming of the package unit further includes performing a dicing process before the stacking of the package units on the substrate, the dicing process separating the package units.

In yet further embodiments, the dicing process uses one of a laser, a saw, and a knife, and comprises cutting the top layer and the bottom layer at the outside of the redistribution structure of the semiconductor chip.

According to other embodiments of the present invention, semiconductor packages include: package units that are sequentially stacked on a substrate, each of the package units including a semiconductor chip having a pad, a bottom layer and a top layer substantially surrounding the semiconductor chip, and a redistribution structure penetrating the top layer so as to contact the pad. The semiconductor chip is surrounded by the top layer and the bottom layer having a lower modulus than the redistribution structure and the semiconductor chip.

In other embodiments, the bottom layer and the top layer are formed of a material having a modulus between about 10 MPa and about 1 GPa.

In still other embodiments, the bottom layer and the top layer are at least one of silicone compounds, rubber compounds, photosensitive resin compounds, and synthetic resin compounds.

In even other embodiments, the bottom layer and the top layer have a thickness between about 10 μm and about 1000 μm.

In yet other embodiments, the semiconductor chip has a thickness between about 10 μm and about 100 μm.

In further embodiments, the redistribution structure covers an inner wall of a via hole, the via hole extending from the pad and penetrating the top layer and the bottom layer, and the semiconductor package further includes connecting elements between the package units, the connecting elements electrically connecting the redistribution structures of the package units and other package units above and below the package units.

In still further embodiments, the connecting element is inserted into the via holes of another package unit above or below the connecting element.

In even further embodiments, a melting point of the connecting element decreases as a position of the corresponding package unit becomes far from the substrate.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor package comprising:
    a substrate; and
    at least one package unit disposed on the substrate, the package unit including:
        a semiconductor chip having a pad;
        a bottom layer disposed below the semiconductor chip;
        a top layer disposed on the semiconductor chip, the bottom layer and the top layer substantially surrounding the semiconductor chip; and
        a redistribution structure overlying the top layer, the redistribution structure electrically connected to the pad,
    wherein the top layer and the bottom layer each comprise a material having a lower modulus than the redistribution structure and the semiconductor chip.

2. The semiconductor package of claim 1, wherein the top layer and the bottom layer each comprise a material having a modulus between about 10 MPa and about 1 GPa.

3. The semiconductor package of claim 1, wherein the bottom layer and the top layer comprise at least one of silicone compounds, rubber compounds, photosensitive resin compounds, and synthetic resin compounds.

4. The semiconductor package of claim 1, wherein the bottom layer and the top layer have a thickness between about 10 μm and about 1000 μm.

5. The semiconductor package of claim 1, wherein the semiconductor chip has a thickness between about 10 μm and about 100 μm.

6. The semiconductor package of claim 1, wherein the redistribution structure is extended from the pad and covers an inner wall of a via hole that penetrates the top layer and the bottom layer.

7. The semiconductor package of claim 6, wherein the at least one package unit comprises a plurality of package units sequentially stacked on the substrate and each of the package units comprises a connecting element disposed in the via hole, and wherein the connecting elements of adjacent ones of the plurality of package units electrically connect the redistribution structures of the adjacent package units.

8. The semiconductor package of claim 7, further comprising a substrate connecting element electrically connecting the connecting elements of the package units to a substrate pad on the substrate.

9. The semiconductor package of claim 7, wherein the connecting elements of package units stacked farther from the substrate have a melting point less than melting points of connecting elements of package units stacked closer to the substrate.

10. The semiconductor package of claim 7, wherein the plurality of package units are sequentially stacked on the substrate such that the top layer of each of the package units is farther from the substrate than the bottom layer.

11. The semiconductor package of claim 7, wherein the plurality of package units are sequentially stacked on the substrate such that the bottom layer of each of the package units is farther from the substrate than the top layer.

12. The semiconductor package of claim 7, wherein at least one of the semiconductor chips is different from at least one other of the semiconductor chips in one or more of size, shape, and function.

13. The semiconductor package of claim 1, wherein the top layer and the bottom layer each comprise a different material.

14. The semiconductor package of claim 1, wherein the top layer and the bottom layer comprise the same material.

* * * * *